(12) United States Patent
Fenchel (10) Patent No.: US 10,386,433 B2
(45) Date of Patent: Aug. 20, 2019

(54) MAGNETIC RESONANCE FINGERPRINTING METHOD AND APPARATUS WITH COMPARISON OF SIGNAL WAVEFORMS IN DIFFERENT DATABASES

(71) Applicant: Siemens Healthcare GmbH, Erlangen (DE)

(72) Inventor: Matthias Fenchel, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 144 days.

(21) Appl. No.: 15/292,250

(22) Filed: Oct. 13, 2016

(65) Prior Publication Data

US 2017/0108566 A1   Apr. 20, 2017

(30) Foreign Application Priority Data

Oct. 15, 2015   (DE) ........................ 10 2015 220 078

(51) Int. Cl.
*G01R 33/48*   (2006.01)
*G01R 33/56*   (2006.01)
*G01R 33/563*   (2006.01)

(52) U.S. Cl.
CPC ..... *G01R 33/4828* (2013.01); *G01R 33/5602* (2013.01); *G01R 33/56341* (2013.01)

(58) Field of Classification Search
None
See application file for complete search history.

(56) References Cited

U.S. PATENT DOCUMENTS

2013/0265047 A1   10/2013   Griswold et al.
2015/0346301 A1*  12/2015   Cauley ................. G01R 33/50
                                                    324/309

OTHER PUBLICATIONS

Ma et al., "Magnetic resonance fingerprinting," Nature, vol. 495, Nr. 7440, pp. 187-192 (2013).
(Continued)

*Primary Examiner* — Douglas X Rodriguez
(74) *Attorney, Agent, or Firm* — Schiff Hardin LLP (57) ABSTRACT

In a method and magnetic resonance apparatus for implementing a magnetic resonance fingerprinting examination of an examination subject, a first signal waveform database containing multiple first database signal waveforms is provided to a processor, and a second signal waveform database is generated therefrom with a fewer number of signal waveforms therein than said multiple first database signal waveforms. A magnetic resonance signal waveform of a voxel of an examination region is acquired using a magnetic resonance fingerprinting method, and this is compared to the second database signal waveforms, and the comparison result is provided in electronic form.

14 Claims, 3 Drawing Sheets

(56) References Cited

OTHER PUBLICATIONS

Martinez-Möller et al, "Tissue Classification as a Potential Approach for Attenuation Correction in Whole-Body PET/MRI: Evaluation with PET/CT Data," The Journal of Nuclear Medicine, vol. 50, No. 4, pp. 520-526 (2009).

Catana et al., "Toward Implementing an MRI-Based PET Attenuation-Correction Method for Neurologic Studies on the MR-PET Brain Prototype," The Journal of Nuclear Medicine, vol. 51, No. 9, pp. 1431-1438 (2010).

McGivney et al., "SVD Compression for Magnetic Resonance Fingerprinting in the Time Domain," IEEE Transactions on Medical Imaging, vol. 33, No. 12, pp. 2311-2322 (2014).

Cauley et al., "Fast Group Matching for MR Fingerprinting Reconstruction," Magnetic Resonance in Medicine, vol. 74, pp. 523-528 (2015).

\* cited by examiner

FIG 4

MAGNETIC RESONANCE FINGERPRINTING METHOD AND APPARATUS WITH COMPARISON OF SIGNAL WAVEFORMS IN DIFFERENT DATABASES

BACKGROUND OF THE INVENTION

Field of the Invention

The invention concerns a method for conducting a magnetic resonance fingerprinting (MRF) examination of an examination subject, as well as a magnetic resonance apparatus and a non-transitory data storage medium to implement such a method.

Description of the Prior Art

In a magnetic resonance apparatus, also known as a magnetic resonance tomography system, the body of an examination subject, in particular a patient, is typically exposed to a relatively strong basic magnetic field, of 1.5 or 3 or 7 tesla for example, with the use of a basic field magnet. In addition, magnetic gradient fields are activated with the use of a gradient coil arrangement. Radio-frequency pulses, such as excitation pulses, are then radiated by suitable antennas of a radio-frequency antenna arrangement, which result in the nuclear spins of certain atoms having excited into resonance by the radio-frequency pulses, and those nuclear spins are tipped through a defined flip angle relative to the field lines of the basic magnetic field. During the relaxation of the nuclear spins, radio-frequency signals, referred to as magnetic resonance signals, are emitted, and are received by suitable radio-frequency antennas, and then processed further. Finally, the desired image data can be reconstructed from the thus acquired raw data.

A magnetic resonance fingerprinting method is known from the article by Ma et al. titled "Magnetic Resonance Fingerprinting", published in Nature, 495, 187-192 (14 Mar. 2013). The magnetic resonance fingerprinting method constitutes a quantitative magnetic resonance method by which quantitative values of tissue parameters of an examination subject can be determined. An advantage of the magnetic resonance fingerprinting method in this case is that a number of tissue parameters, for example a T1 relaxation time and a T2 relaxation time, can be acquired simultaneously in a single measurement. In this way the magnetic resonance fingerprinting method can make the use of a number of different scan sequences for acquiring the multiple tissue parameters unnecessary, and thereby reduce the complexity and/or scan time of a magnetic resonance examination.

SUMMARY OF THE INVENTION

An object of the invention is to enable an improved magnetic resonance fingerprinting examination.

The inventive method for a magnetic resonance fingerprinting examination of an examination subject has the following steps:

A first signal waveform database, containing a number of first database signal waveforms is made accessible in a processor.

A second signal waveform database is generated using the first signal waveform database, the second signal waveform database containing a number of second database signal waveforms that is less than the number of first database signal waveforms in the first signal waveform database.

A magnetic resonance signal waveform of a voxel of an examination region of the examination subject is acquired by operating a magnetic resonance data acquisition scanner to execute a magnetic resonance fingerprinting method.

A signal comparison of the magnetic resonance signal waveform with the second database signal waveforms of the second signal waveform database is implemented in the processor, and the result of the signal comparison is made available in electronic form from the processor.

The examination subject may be a patient, a healthy test subject, an animal or a phantom. The examination region, also known as the volume of interest or field of view (FOV), represents a volume that is imaged in the acquired magnetic resonance image data. The examination region is typically specified by a user, for example on a planning scan (localizer). Alternatively or in addition, the examination region can of course also be specified automatically, on the basis of a selected protocol for example. The manner in which the result of the signal comparison is provided may be displaying the result of the signal comparison on a display monitor and/or storing the result of the signal comparison in a database.

The magnetic resonance fingerprinting method typically provides the acquisition of a magnetic resonance signal waveform of the voxel by means of a pseudorandomized or non-coherent acquisition scheme, and thereafter a signal comparison of the magnetic resonance signal waveform with a number of database signal waveforms.

The acquired magnetic resonance signal waveform indicates how a signal value of a magnetic resonance signal recorded in the voxel changes during the acquisition of the magnetic resonance signal waveform. In this case the voxel indicates the region from which the magnetic resonance signal waveform is acquired. It is also conceivable for the magnetic resonance signal waveform to be acquired from a region having a coarser resolution than a voxel. In that case, the magnetic resonance signal waveform can be acquired, for example, averaged over a number of voxels. In a typical application case, a number of magnetic resonance signal waveforms are acquired simultaneously from a number of voxels. For this purpose, a number of raw images can be acquired by the magnetic resonance fingerprinting method in a temporal sequence, and the multiple magnetic resonance signal waveforms then can be formed by the individual voxels of the multiple raw images. The temporal resolution of the magnetic resonance signal waveform is in this case determined by the temporal distance between the acquisition of different magnetic resonance signals. In the magnetic resonance fingerprinting method, different scan parameters are set for the acquisition of the different magnetic resonance signals. The scan parameters can be varied in a pseudo-randomized or non-coherent manner. Possible scan parameters that are varied during the acquisition of the magnetic resonance signal waveform are, for example, an echo time, an embodiment and/or number of radio-frequency pulses, an embodiment and/or number of gradient pulses, a diffusion encoding sequence, etc. In this way a magnetic resonance signal waveform that is characteristic of the voxel, referred to as a fingerprint of the voxel, can be acquired by the magnetic resonance fingerprinting method.

The multiple database signal waveforms with which the acquired magnetic resonance signal waveform is compared are in this case stored in a signal waveform database. A different database value of at least one tissue parameter is in this case advantageously assigned to each of the different database signal waveforms. A specific database signal waveform then in each case represents the signal waveform to be expected in the magnetic resonance fingerprinting method when a sample is examined whose material properties correspond to those of the associated database value of the at least one tissue parameter. The database signal waveforms can be determined for example in a calibration measurement and/or can be simulated. The magnetic resonance fingerprinting method then typically provides that one database signal waveform of the number of database signal waveforms is assigned to the acquired magnetic resonance signal waveform on the basis of the result of the signal comparison. The signal comparison can in this case be determining a similarity of the acquired magnetic resonance signal waveform with the multiple database signal waveforms, with that database signal waveform of the multiple database signal waveforms being assigned to the voxel that exhibits the greatest similarity with the magnetic resonance signal waveform. The database value of the at least one tissue parameter belonging to the assigned database signal waveform can then be set as a measured value of the at least one tissue parameter. The measured value of the at least one tissue parameter for the voxel obtained by the magnetic resonance fingerprinting method can then be displayed or stored as the result of the signal comparison. Possible tissue parameters that can be quantified by the magnetic resonance fingerprinting method are: a T1 relaxation time, a T2 relaxation time, a diffusion value (e.g. an apparent diffusion coefficient (ADC)), a magnetization moment, a proton density, a resonant frequency, a concentration of a substance, etc. Further tissue parameters considered beneficial by those killed in the art are also conceivable.

The approach according to the invention now provides that the magnetic resonance signal waveform is compared in the signal comparison with the second database signal waveforms of the second signal waveform database. The signal comparison is carried out with all second database signal waveforms of the second signal waveform database. The first signal waveform database is no longer used for the signal comparison. The first signal waveform database can be a generic magnetic resonance fingerprinting database, which is employed for a multiplicity of applications and/or is provided by a vendor of the magnetic resonance fingerprinting application. The second signal waveform database, in contrast, can be generated so that it is specifically tailored to a desired application case or is especially suitable for the magnetic resonance fingerprinting examination of the examination subject. For example, the second signal waveform database may, as described below, be particularly suitable for determining a limited number of material classes in the examination region. In this way the second signal waveform database can be reduced in size compared to the first signal waveform database, such as only to the database signal waveforms of a limited number of material classes. The second signal waveform database can constitute a compact representation of the first signal waveform database, in particular for an actual application case.

Generating the second signal waveform database using the first signal waveform database maybe implemented by the second signal waveform database being generated through adaptation of the first signal waveform database. The second signal waveform database can in this case be generated offline in a preparatory phase of the magnetic resonance fingerprinting examination of the examination subject. It is also conceivable for the second signal waveform database to be generated specifically for the magnetic resonance fingerprinting examination. It is also possible for the second signal waveform database to be generated only after the acquisition of the magnetic resonance signal waveform, but prior to the signal comparison. The generation of the second signal waveform database using the first signal waveform database can be performed automatically, but also semi-automatically or manually. The first signal waveform database or the first database signal waveforms can represent an input parameter of a fitting algorithm that has the second signal waveform database or the second database signal waveforms as output parameter. As described in more detail below, the second database signal waveforms can represent a subset of the first database signal waveforms, or can be selected from the first database signal waveforms. In this way, only a reduction in the number of database signal waveforms can be achieved in the generation of the second signal waveform database from the first signal waveform database. It is, however, also conceivable that the second database signal waveforms themselves are modified, for example in their signal values, with respect to the corresponding first database signal waveforms when the second signal waveform database is generated. In certain cases the second signal waveform database may also contain second database signal waveforms that are not contained in the first signal waveform database.

The inventive approach is based on the insight that a signal comparison of the magnetic resonance signal waveform with a reduced number of second database signal waveforms can be particularly advantageous for certain application cases. The first signal waveform database used for a conventional magnetic resonance fingerprinting method typically contains a large number of first database signal waveforms. In this case the number of first database signal waveforms can be particularly large when a number of tissue parameters are to be determined and/or the tissue parameters are to be determined in a fine discretization. If, for example, two tissue parameters are to be determined by a conventional magnetic resonance fingerprinting method, for example a T1 relaxation time and a T2 relaxation time, in a gradation of 1 ms in a value range of 0 to 2000 ms in each case, then the first signal waveform database will typically contain more than four million first database signal waveforms. According to a conventional magnetic resonance fingerprinting method, it is therefore necessary to conduct an extensive and time-consuming signal comparison of the magnetic resonance signal waveform with the multiple database signal waveforms. This complexity of the signal comparison can be reduced in the approach according to the invention since the acquired magnetic resonance signal waveform is compared only selectively with the second database signal waveforms of the second signal waveform database. Accordingly, the approach according to the invention advantageously has a signal waveform database that is significantly reduced in size compared to a conventional magnetic resonance fingerprinting method. The method step of the signal comparison there can be performed with reduced computational outlay.

At the same time, the second database signal waveforms of the second signal waveform database can be chosen such that they allow a particularly simple assignment of the magnetic resonance signal waveform. Thus, the second database signal waveforms can be chosen such that they exhibit particularly strong differences from one another. As described in more detail below, this also enables an acquisition scheme of the magnetic resonance fingerprinting method to be particularly advantageously aligned to the second database signal waveforms of the second signal waveform database.

In an embodiment, the second database signal waveforms are a subset of the first database signal waveforms. In this case, therefore, all of the second database signal waveforms are also included in the set of first database signal waveforms. The second database signal waveforms are transferred across from the first database signal waveforms without any modification of the signal values. In this way the second signal waveform database can be generated particularly easily using the first signal waveform database.

In another embodiment, the generation of the second signal waveform database using the first signal waveform database involves a selection of some of the multiple first database signal waveforms, wherein this portion of the multiple first database signal waveforms forms the number of second database signal waveforms of the second signal waveform database. The portion of the multiple first database signal waveforms can be selected by a user, or automatically or semi-automatically. For the generation of the second signal waveform database, therefore, individual first database signal waveforms of the first signal waveform database are selected that are then set as second database signal waveforms of the second signal waveform database. In this case as well, the second database signal waveforms thus are a subset of the first database signal waveforms.

In another embodiment, the selection of the portion of the multiple first database signal waveforms involves predefining a number of material classes, and those first database signal waveforms are selected that represent the multiple predefined material classes. Generally, a material class of the multiple material classes represents an n-dimensional subdomain of the database in which the multiple first database signal waveforms are stored. In this case the multiple material classes include materials having different physical properties. The material classes can be different types of body tissue of the examination subject, and thus be tissue classes. In this case different material classes can be assigned different values of tissue parameters, e.g. a specific parameter profile, in the second signal waveform database. The multiple material classes can be predefined automatically, semi-automatically or manually. The predefinition of the multiple material classes can be dependent on a specific application case, for example on the material classes which are provided for a segmentation of the examination region. The database signal waveform that represents a material class of the multiple material classes constitutes the signal waveform to be expected in the magnetic resonance fingerprinting method, in particular when a sample of a material from the material class is examined. A first database signal waveform can thus be selected for each material class so that then the number of second database signal waveforms of the second signal waveform database corresponds to the number of the multiple material classes. A material class can be assigned more than one first database signal waveform. This embodiment thus enables a targeted identification of the number of material classes in the voxel of the examination region by the magnetic resonance fingerprinting method.

In another embodiment, the multiple material classes include at least one material class from the following list: air, fat, soft tissue, pulmonary parenchyma, bone. In particular, a segmentation of the examination region into the cited material classes, as described in more detail below, can be advantageous. Other material classes considered beneficial by those skilled in the art are also conceivable.

In a further embodiment, the second signal waveform database is generated using the first signal waveform database by execution of an algorithm that employs an unsupervised learning method and uses the multiple first database signal waveforms and/or tissue parameters that are assigned to the multiple first database signal waveforms as input parameters. Unsupervised learning is a specialized form of machine learning in which a computing system attempts, in most cases without further specifications from outside, to determine structures in unstructured data. The algorithm can use, for example, a cluster analysis (clustering) and/or a support vector machine method and/or a linear discriminant analysis as an unsupervised learning method. Further unsupervised learning methods considered beneficial by those skilled in the art are also conceivable. Generally, the algorithm can perform data mining with respect to the multiple first database signal waveforms and/or the assigned tissue parameters. The algorithm can in this way, in particular automatically, identify structures in the multiple first database signal waveforms and/or the assigned tissue parameters. For example, the algorithm can determine first database signal waveforms exhibiting particularly strong differences from one another and/or assigned tissue parameters. An optimized acquisition scheme as described below can also be incorporated as an input parameter in the algorithm. In this way an optimal second signal waveform database can be determined in relation to the optimized acquisition scheme. Generally, the output parameters of the algorithm are formed by the second signal waveform database or the second database signal waveforms. The second signal waveform database determined in this way by the algorithm can accordingly represent a compact signal waveform database for the signal comparison of the magnetic resonance fingerprinting method.

In another embodiment, the unsupervised learning method automatically classifies the multiple first database signal waveforms and/or the tissue parameters into a number of material classes and selects at least one first database signal waveform for each of the multiple material classes. The multiple of first database signal waveforms selected in this way form the multiple second database signal waveforms of the second signal waveform database. The material classes can be represented by the aforementioned tissue classes. A first database signal waveform thus can be selected for each material class, such that the number of second database signal waveforms of the second signal waveform database then corresponds to the multiple the plurality of material classes. As noted, a material class can be assigned more than one first database signal waveform. Similarly, a material class can be assigned an averaged signal waveform or a signal waveform determined by some other suitable weighted combination. In this way the algorithm can determine a small number of second database signal waveforms, in particular signal waveforms exhibiting particularly strong differences from one another, for the second signal waveform database. The algorithm can also determine a small number of tissue parameters, in particular tissue parameters exhibiting particularly strong differences from one another, and subsequently identify the material classes assigned to the tissue parameters. The selected first database signal waveforms identified in this way by the algorithm or, as the case may be, the tissue parameters assigned to the selected first database signal waveforms may be particularly suitable for classifying the magnetic resonance signal waveform of the voxel into a material class of the multiple material classes.

In another embodiment, the unsupervised learning method is carried out under a predefined boundary condition that specifies a maximum number for the multiple material classes. The boundary condition can be predefined manually or semi-automatically. The boundary condition can be incorporated as a further input parameter in the algorithm that employs the unsupervised learning method. The boundary condition enables a particularly compact second signal waveform database and thereby allows a particularly effective classification of the acquired magnetic resonance signal waveform.

In another embodiment, an acquisition scheme of the magnetic resonance fingerprinting method that is employed for acquiring the magnetic resonance signal waveform is optimized using the second signal waveform database. The acquisition scheme, for example, can specify a sequence and/or a time for the application of radio-frequency pulses and/or switching of gradients for the magnetic resonance fingerprinting method. Furthermore, as described in more detail below, the acquisition scheme can include scan parameters which can be optimized. The optimization of the acquisition scheme is accomplished by execution of an optimization algorithm that has, as input parameters, an acquisition scheme that is to be optimized and the second signal waveform database or, the second database signal waveforms of the second signal waveform database. The acquisition scheme that is to be optimized can be, for example, a generic acquisition scheme that is utilized for a conventional magnetic resonance fingerprinting method, which uses the first signal waveform database. An output parameter of the optimization algorithm is then an optimized acquisition scheme that can be used for the acquisition of the magnetic resonance signal waveform. The optimized acquisition scheme is then particularly suitably aligned to the second database signal waveforms of the second signal waveform database. The acquisition scheme can be optimized such that a particularly simple assignment of the magnetic resonance signal waveform, acquired by execution of the optimized acquisition scheme, to a second database signal waveform of the second signal waveform database can be realized. At the same time, an iterative optimization of the acquisition scheme and of the signal waveform database is also conceivable. Thus, for example, a new optimization of the second signal waveform database can be carried out based on the optimized acquisition scheme.

In another embodiment, the multiple second database signal waveforms of the second signal waveform database represent different material classes and the optimization of the acquisition scheme using the second signal waveform database is implemented by choosing scan parameters of the acquisition scheme on the basis of the different material classes. The scan parameters of the acquisition scheme can be, for example, flip angles, repetition times, echo times, number of averages used during the magnetic resonance fingerprinting method, etc. Input parameters for the optimization algorithm can then be generic scan parameters that are utilized for a conventional magnetic resonance fingerprinting method which uses the first signal waveform database. The material classes can be formed, for example by the aforementioned tissue classes to which different tissue parameters are assigned. By use of the optimization algorithm, the scan parameters of the acquisition scheme can be particularly advantageously aligned to the material classes for which the second database signal waveforms are stored in the second signal waveform database. In this way the acquisition scheme can be optimized such that the magnetic resonance fingerprinting method can differentiate particularly clearly between the material classes.

In another embodiment, the optimization of the acquisition scheme using the second signal waveform database is carried out taking into consideration a first optimization criterion which requires the clearest possible assignment of the magnetic resonance signal waveform to the second database signal waveforms of the second signal waveform database in the signal comparison. The fact that the optimization is performed taking into consideration an optimization criterion means that the optimization criterion contributes a value to an optimization function of the optimization algorithm. The first optimization criterion can ensure that the magnetic resonance signal waveform acquired by the magnetic resonance fingerprinting method can be assigned in a particularly robust manner to a second database signal waveform of the multiple second database signal waveforms. In this way the matching second database signal waveform can be determined in a particularly robust manner for the voxel of the examination region. Accordingly, the tissue parameters can be determined in a particularly robust manner for the voxel and/or the matching material class can be assigned. The degree of accuracy in the assignment of the material class can also be increased in this way.

In a further embodiment, the optimization of the acquisition scheme using the second signal waveform database is carried out taking into consideration a second optimization criterion that requires the shortest possible scan time for acquiring the magnetic resonance signal waveform. Precisely because the second signal waveform database has fewer database signal waveforms than the first signal waveform database, it can be more feasible to reduce the scan time for acquiring the magnetic resonance signal waveform. In spite of the shortened scan time, it may still be possible, due to the reduced number of second database signal waveforms, to achieve a robust assignment of the magnetic resonance signal waveform to a second database signal waveform. In this way the measurement time for acquiring the magnetic resonance signal waveform can be reduced. A suitable combination of the optimization criteria with regard to robustness and efficiency is also conceivable.

The first optimization criterion and the second optimization criterion can be used independently of one another, or in combination.

In another embodiment, the optimization of the acquisition scheme using the second signal waveform database makes use of at least one of the following optimization algorithms: a brute-force search strategy, a genetic programming algorithm, an evolutionary algorithm, etc. The signal waveforms to be expected can also be determined through simulation based on the Bloch equations. The cited optimization algorithms are known to those skilled in the art, so they need not be discussed in more detail herein. Other optimization algorithms considered beneficial by those skilled in the art are also conceivable. The simulation of the expected signal waveforms by the use of the Bloch equations can include a calculation of the expected signal waveform in a specific choice of the acquisition scheme, in particular of the scan parameters of the acquisition scheme. The acquisition scheme can be optimized on the basis of the simulated signal waveform and subsequently the expected signal waveforms can be determined afresh by the use of the Bloch equations. In this way the simulation of the expected signal waveforms can provide an iterative approach for optimizing the acquisition scheme. The signal waveforms to be expected can also be determined by calibration measurements, this approach being feasible in practice in a meaningful way only with a more compact number of signal waveforms.

In another embodiment, the multiple second database signal waveforms of the second signal waveform database represent different material classes and a material class of the multiple material classes is assigned to the voxel of the examination region on the basis of the result of the signal comparison. The voxel of the examination region is assigned to that material class that is represented by the second database signal waveform of the multiple second database signal waveforms that is determined in the signal comparison. Information associated with the voxel and indicating which material class has been measured in the voxel by the magnetic resonance fingerprinting method can then be stored in a database or displayed.

In another embodiment, magnetic resonance signal waveforms are acquired for all voxels of the examination region and compared with the second database signal waveforms of the second signal waveform database, wherein all voxels of the examination region are assigned the respective material class of the multiple material classes on the basis of the result of the signal comparisons. In this case, providing the result of the signal comparison is providing a map of the examination region segmented into the multiple material classes. Providing the result of the signal comparison can entail providing the segmented map of the examination region, namely displaying, storing, further processing or making further use of the segmented map. The segmentation of the examination region into the multiple material classes is performed in particular on the basis of the assignment of the multiple material classes to the voxels of the examination region. Thus, a subregion of the examination region, to which a specific material class of the multiple material classes is assigned by the magnetic resonance fingerprinting method, is assigned the specific material class during the segmentation. In this way the segmented map of the examination region can be obtained directly from the measured data of the magnetic resonance fingerprinting method by the inventive approach. There is no need for any further, potentially time-consuming and/or error-prone, post-processing of the measured data of the magnetic resonance fingerprinting method in order to generate the segmented map. There is also no need to acquire any morphological images for the purpose of generating the segmented map. The segmented map may also possess a high degree of accuracy or robustness, since the measured data obtained by the adapted magnetic resonance fingerprinting method is particularly advantageously aligned to the multiple material classes. The segmented map of the examination region obtained in this way directly from the measured data of the magnetic resonance fingerprinting method can be used for a variety of applications. The segmented map can be used, for example, for planning an irradiation of the examination subject. For this purpose a value of an electron density, for example a linear attenuation coefficient, can be stored for the plurality of material classes. In this way an electron density map required for planning the irradiation can be determined particularly easily from the segmented map of the examination region, which advantageously covers a planning volume. It is also conceivable for the segmented map to be used for a magnetic resonance-based attenuation correction of emission data, for example positron emission data (PET data) or single-photon emission data (SPECT data). Linear attenuation coefficients assigned to the material classes into which the examination region is segmented can also be stored for that purpose.

The segmented map can provide, for example, a segmentation of joints and/or cartilage. The segmented map may be used, for example, as a basis for determining characteristics of organs of the examination subject, of organ volumes for example.

The magnetic resonance apparatus according to the invention has a data acquisition scanner and a computer that includes a first provider processor, a generation processor, a signal comparison processor and a second provider processor, the magnetic resonance apparatus being designed for performing the method according to the invention.

The magnetic resonance apparatus is accordingly designed for performing a method for a magnetic resonance fingerprinting examination of an examination subject. The first provider processor is configured to provide a first signal waveform database containing a number of first database signal waveforms. The generation processor is configured to generate a second signal waveform database using the first signal waveform database, wherein the second signal waveform database contains a number of second database signal waveforms, with the number of the second database signal waveforms being less than the number of the first database signal waveforms. The data acquisition scanner is operated to acquire a magnetic resonance signal waveform of a voxel of an examination region of the examination subject by execution of a magnetic resonance fingerprinting method. The signal comparison number is configured to perform a signal comparison of the magnetic resonance signal waveform with the second database signal waveforms of the second signal waveform database. The second provider processor is configured to provide a result of the signal comparison as an electronic output signal.

The majority of the components of the computer of the inventive magnetic resonance apparatus, including the first provider processor, generation processor, signal comparison processor and second provider processor, can be embodied in the form of software components. In principle, however, these components can also be realized in some instances, in particular when particularly fast calculations are involved, in the form of software-assisted hardware components, such as FPGAs or the like. Equally, the required interfaces can be embodied as software interfaces, for example when it is simply a matter of importing data from other software components. They can, however, also be embodied as hardware-based interfaces which are controlled by suitable software. It is of course also conceivable for a number of the cited components to be implemented in combination in the form of a single software component or software-assisted hardware component.

The present invention also encompasses a non-transitory, computer-readable data storage medium encoded with programming instructions that, when the storage medium is loaded into a control computer of a magnetic resonance apparatus, causes the control computer to operate the magnetic resonance apparatus so as to execute the method in accordance with the invention as described above.

Examples of electronically readable data storage media are a DVD, a magnetic tape or a USB stick on which electronically readable control information, in particular software (cf. above), is stored.

The advantages of the inventive magnetic resonance apparatus and of the inventive computer program product essentially correspond to the advantages of the inventive method, as presented in detail above. Features, advantages or alternative embodiment variants mentioned in this context are applicable as well to the other aspects of the invention. The functional features of the method are as corresponding object-related modules, in particular by hardware modules.

DESCRIPTION OF THE PREFERRED EMBODIMENTS

Figure 1:
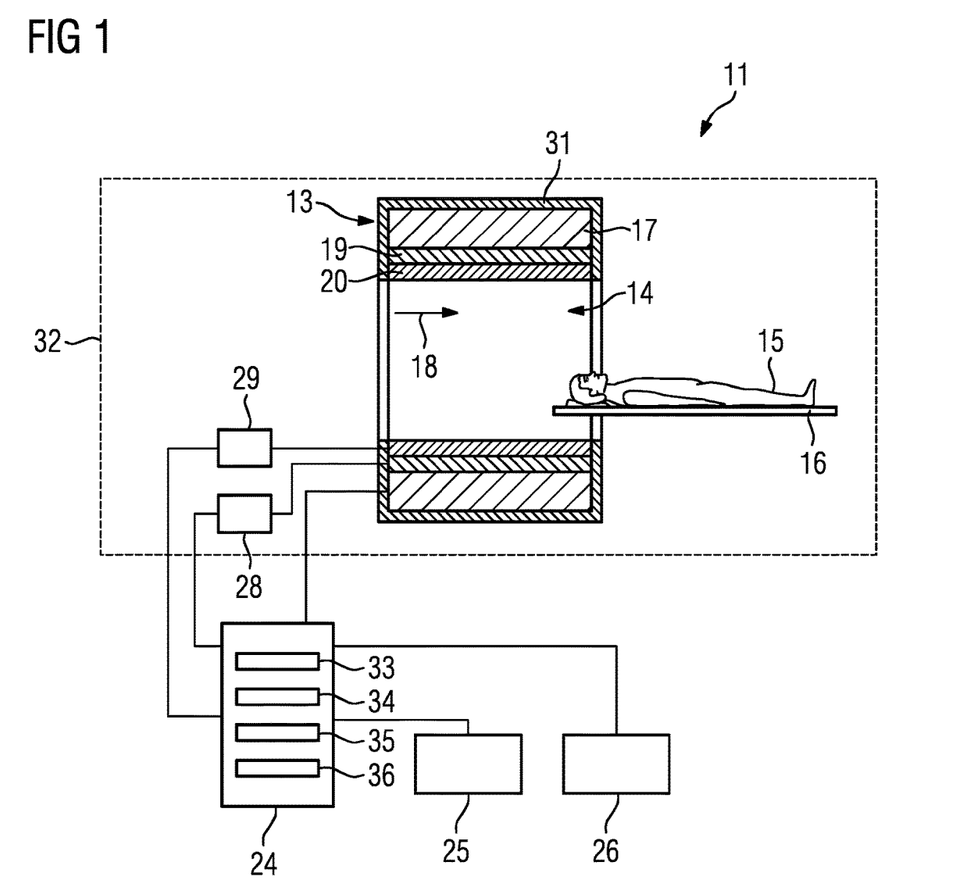
FIG. 1 is a schematic illustration of a magnetic resonance apparatus according to the invention.

FIG. 1 schematically depicts an inventive magnetic resonance apparatus 11. The magnetic resonance apparatus 11 has a data acquisition scanner 13 having a basic field magnet 17 that generates a strong and constant basic magnetic field 18. The scanner 13 has a cylinder-shaped patient receiving zone 14 for accommodating an examination subject 15, in the present case a patient, the patient receiving zone 14 being cylindrically enclosed by the scanner 13 in a circumferential direction. The patient 15 can be introduced into the patient receiving zone 14 by a patient support 16 of the magnetic resonance apparatus 11. For this purpose, the patient support 16 has a patient table arranged so as to be movable inside the scanner 13. The scanner 13 is shielded externally by a housing shell 31.

The scanner 13 additionally has a gradient coil arrangement 19 that generates magnetic field gradients for spatial encoding of the magnetic resonance signals during an imaging session. The gradient coil arrangement 19 is operated by a gradient control processor 28. The scanner 13 furthermore has a radio-frequency antenna 20, which in the case shown is formed as a body coil permanently integrated in the scanner 13, and a radio-frequency antenna control processor 29. The radio-frequency antenna 20 is operated by the radio-frequency antenna control processor 29 to radiate radio-frequency magnetic resonance sequences into an examination volume that is substantially formed by the patient receiving zone 14. Radio-frequency pulses (excitation pulses) within the sequence cause certain nuclear spins in the patient 15 to be deflected from the polarization established by the basic magnetic field. As those nuclear spins relax, they emit radio-frequency signals, known as magnetic resonance signals. The radio-frequency antenna 20 is furthermore designed to receive the magnetic resonance signals from the patient 15.

The magnetic resonance apparatus 11 has a computer 24 that controls the basic field magnet 17, the gradient control processor 28 and the radio-frequency antenna control processor 29. The computer 24 is responsible for the centralized control of the magnetic resonance apparatus 11, such as to perform a predetermined imaging gradient echo sequence. Control information such as imaging parameters, as well as reconstructed magnetic resonance images, can be provided for a user on an output interface 25, in the present case a display monitor, of the magnetic resonance apparatus 11. The magnetic resonance apparatus 11 additionally has an input interface 26, via which information and/or parameters can be entered as inputs by a user during a measurement procedure. The computer 24 can include the gradient control processor 28 and/or the radio-frequency antenna control processor 29 and/or the output interface 25 and/or the input interface 26.

In the case shown, the computer 24 has a first provider processor 33, a generation processor 34, a signal comparison processor 35 and a second provider processor 36.

The magnetic resonance apparatus 11 is configured overall with the scanner 13 and the computer 24 to perform the inventive method for a magnetic resonance fingerprinting examination of the examination subject 15.

The illustrated magnetic resonance apparatus 11 can have further components that are ordinarily present in magnetic resonance apparatuses. The general principles of operation of a magnetic resonance apparatus are known to those skilled in the art, so a detailed description is not necessary herein.

Figure 2:
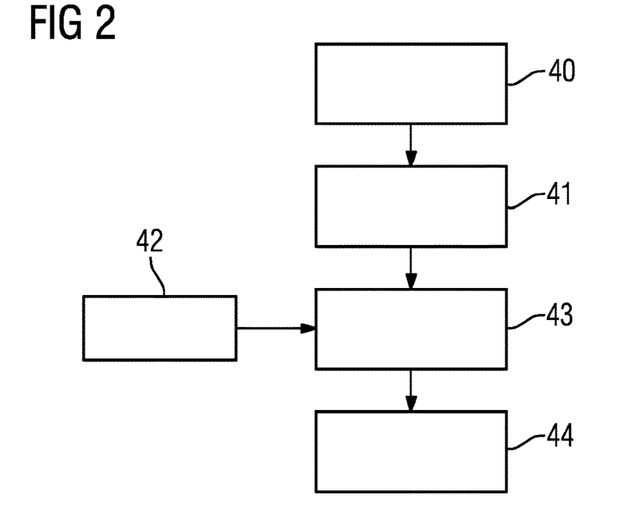
FIG. 2 is a flowchart of a first embodiment of the method according to the invention.

FIG. 2 is a flowchart of a first embodiment variant of an inventive method for a magnetic resonance fingerprinting examination of an examination subject 15.

In a first method step 40, a first signal waveform database, containing multiple first database signal waveforms, is provided by the first provider processor 33.

In a further method step 41, a second signal waveform database, is generated by the generation processor 34, using the first signal waveform database, so the second signal waveform database contains multiple second database signal waveforms, with the number of second database signal waveforms being less than the number of first database signal waveforms.

In a further method step 42, a magnetic resonance signal waveform of a voxel of an examination region of the examination subject is acquired by execution of a magnetic resonance fingerprinting method by the scanner 13.

In a further method step 43, a signal comparison of the magnetic resonance signal waveform with the second database signal waveforms of the second signal waveform database is conducted by the signal comparison processor 35.

In a further method step 44, the result of the signal comparison is provided as an output in electronic form by the second provider processor 35.

Figure 3:
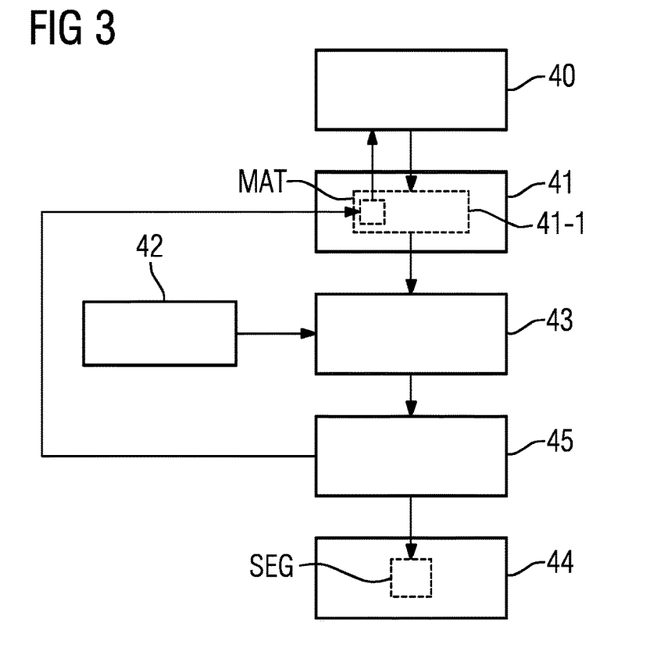
FIG. 3 is a flowchart of a second embodiment of the method according to the invention.

FIG. 3 is a flowchart of a second embodiment variant of an inventive method for a magnetic resonance fingerprinting examination of an examination subject 15.

The following description is limited essentially to the differences compared to the exemplary embodiment in FIG. 2, with reference being made to the description of the exemplary embodiment in FIG. 2 with respect to method steps that remain the same. Method steps that remain substantially the same are labeled consistently with the same reference numerals.

The embodiment of the inventive method shown in FIG. 3 substantially includes the method steps 40, 41, 42, 43, 44 of the first embodiment variant of the inventive method according to FIG. 2. The embodiment of the inventive method shown in FIG. 3 has additional method steps and substeps. An alternative method execution sequence to FIG. 3, which includes only some of the additional method steps and/or substeps shown in FIG. 3, is also conceivable. An alternative method execution sequence to FIG. 3 can also include additional method steps and/or substeps.

In the case shown in FIG. 3, the second database signal waveforms form a subset of the first database signal waveforms. For this purpose, the generation of the second signal waveform database using the first signal waveform database ensues by selecting a portion of (some of) the multiple first database signal waveforms in a substep 41-1 of the further method step 41. The selected waveforms among the multiple first database signal waveforms then form the multiple second database signal waveforms of the second signal waveform database.

The selection of the portion of the multiple first database signal waveforms is implemented by predefining a number of material classes MAT in substep 41-1 of the further method step 41. The number of material classes can include at least one material class from the following list: air, fat, soft tissue, pulmonary parenchyma, bone. In substep 41-1 of the further method step 41, those first database signal waveforms are then selected that represent the multiple predefined material classes.

In the case shown in FIG. 3, the multiple second database signal waveforms of the second signal waveform database therefore represent different material classes. According to the scenario depicted in FIG. 3, the voxel of the examination region can accordingly be assigned a material class among the material classes in a further method step 45 on the basis of the result of the signal comparison. Magnetic resonance signal waveforms can be acquired for all voxels of the examination region and compared with the second database signal waveforms of the second signal waveform database. On the basis of the result of the signal comparisons, the respective material class of the multiple material classes can then be assigned to all of the voxels of the examination region. Providing the result of the signal comparison in the further method step 44 can then, as shown in FIG. 3, be displaying and/or storing a map SEG of the examination region segmented into the multiple material classes.

It should be noted that the selection of the multiple second database signal waveforms on the basis of the predefined material classes as described in FIG. 3 can also be carried out independently of the segmented providing of a map as described in FIG. 3. It is also conceivable for the segmented providing of a map as described in FIG. 3 to be used in the method execution sequence described in FIG. 4. Similarly, the optimization of the acquisition scheme on the basis of the second signal waveform database as described in FIG. 4 can also be carried out in the method described in FIG. 3.

Figure 4:
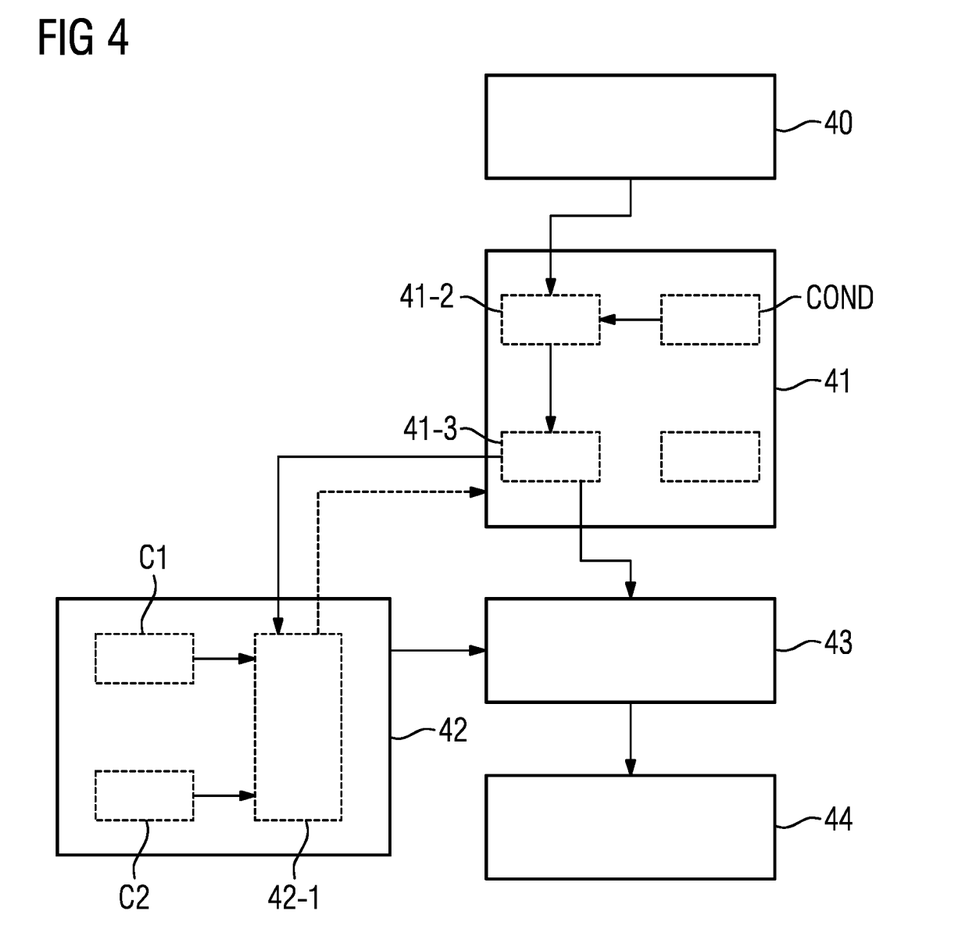
FIG. 4 is a flowchart of a third embodiment of a method according to the invention.

FIG. 4 is a flowchart of a third embodiment of the inventive method for a magnetic resonance fingerprinting examination of an examination subject 15.

The following description is limited essentially to the differences compared to the exemplary embodiment in FIG. 2, with reference being made to the description of the exemplary embodiment in FIG. 2 with respect to method steps that remain the same. Method steps that remain substantially the same are labeled consistently with the same reference numerals.

The embodiment of the inventive method shown in FIG. 4 substantially includes the method steps 40, 41, 42, 43, 44 of the first embodiment variant of the inventive method according to FIG. 2. The embodiment variant of the inventive method shown in FIG. 4 has additional method steps and substeps. An alternative method execution sequence to FIG. 4 that includes only some of the additional method steps and/or substeps shown in FIG. 4 is also conceivable. An alternative method execution sequence to FIG. 4 can also include additional method steps and/or substeps.

In the approach illustrated in FIG. 4, a second signal waveform database is generated in the further method step 41 using the first signal waveform database by execution of an algorithm that employs an unsupervised learning method and, as input parameters, uses the multiple first database signal waveforms and/or tissue parameters that are assigned to the multiple first database signal waveforms. For this purpose, in a substep 41-2 of the further method step 41, the unsupervised learning method automatically classifies the multiple first database signal waveforms and/or the tissue parameters into a number of material classes. In a further substep 41-3 of the further method step 41, at least one first database signal waveform is selected for each of the multiple material classes, the multiple first database signal waveforms selected in this way forming the multiple second database signal waveforms of the second signal waveform database. In this case, the unsupervised learning method can be performed under a predefined boundary condition COND that specifies a maximum number for the multiple material classes.

In addition, according to FIG. 4, in the substep 42-1 of the further method step 42, an acquisition scheme of the magnetic resonance fingerprinting method, which is employed for acquiring the magnetic resonance signal waveform is optimized using the second signal waveform database. The multiple second database signal waveforms of the second signal waveform database in this case represent different material classes. Thus, the optimization of the acquisition scheme using the second signal waveform database can involve choosing scan parameters of the acquisition scheme on the basis of the different material classes. The optimization of the acquisition scheme in substep 42-1 of the further method step 42 using the second signal waveform database can involve the use of at least one of the following optimization algorithms: a brute-force search strategy, a genetic programming algorithm, an evolutionary algorithm, a simulation of expected signal waveforms based on the Bloch equations.

Furthermore, the optimization of the acquisition scheme using the second signal waveform database can be carried out taking into consideration a first optimization criterion COND1 which requires the clearest possible assignment of the magnetic resonance signal waveform to the second database signal waveforms of the second signal waveform database in the signal comparison. The optimization of the acquisition scheme using the second signal waveform database can also be carried out taking into consideration a second optimization criterion COND2 which requires the shortest possible scan time for acquiring the magnetic resonance signal waveform. For example, the second signal waveform database may contain two second database signal waveforms, of which one characterizes a first tissue class t1 and the other characterizes a second tissue class t2. The intention is to optimize scan parameters p of the acquisition scheme, for example flip angles, repetition times and echo times. At the same time it is aimed to keep a number of averages n in the acquisition scheme to an absolute minimum in order to shorten a scan time. The scan parameters p and the number of averages n can then be optimized, for example, as follows:

$$(n,p) = \arg\min\_n \max\_p(\text{distance}(t1, t2))$$

The optimization of the acquisition scheme described in FIG. 4 can also be performed iteratively in conjunction with the generation of the second signal waveform database. Thus, the acquisition scheme optimized in one iteration can be used in the following iteration as a basis for generating an improved second signal waveform database, which in turn can serve as the starting point for a further optimization of the acquisition scheme.

It should be noted that the generation of the second signal waveform database by the unsupervised learning method as described in FIG. 4 can also be accomplished independently of the optimization of the acquisition scheme. The segmented providing of a map as described in FIG. 3 can be integrated in the method execution sequence described in FIG. 4. Similarly, the optimization of the acquisition scheme on the basis of the second signal waveform database as described in FIG. 4 can also be carried out in the method described in FIG. 3.

The method steps of the inventive method depicted in FIGS. 2-4 are performed by the computer. For this purpose the computer has the requisite software and/or computer programs that are stored in a memory of the computer 24.

The software and/or computer programs include program code configured to cause the computer 24 to perform the inventive method when executed in the computer 24.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for magnetic resonance fingerprinting examination of a subject, comprising:
providing a first signal waveform database to a processor, said first signal waveform database containing multiple first database signal waveforms;
providing said processor with an input that defines a plurality of different material classes to be segmented in an examination region of the subject;
in said processor, generating a second signal waveform database comprising multiple second database signal waveforms that are fewer in number than said multiple first database signal waveforms by selecting a number of said first database signal waveforms that represent said defined plurality of different material classes, and that are less than all of said first database signal waveforms, so that said number of first database signal waveforms form said multiple second database signal waveforms, said multiple second signal database waveforms thereby also representing said defined plurality of different material classes;
from said processor, operating a magnetic resonance data acquisition scanner to acquire a magnetic resonance signal waveform of a voxel of said examination region of the subject by executing a magnetic resonance fingerprinting method;
in said processor, conducting a signal comparison of said magnetic resonance signal waveform with the multiple second database signal waveforms in the second signal waveform database to obtain a comparison result and assigning said voxel of said examination region to a material class among said defined plurality of different material classes based on said result of said signal comparison; and
providing said comparison result from said processor in electronic form.

2. A method as claimed in claim 1 comprising generating the multiple second database signal waveforms as a subset of said multiple first database signal waveforms.

3. A method as claimed in claim 1 comprising defining said plurality of material classes to include at least one material class from the group consisting of air, fat, soft tissue, pulmonary parenchyma, and bone.

4. A method as claimed in claim 1 comprising generating said second database signal waveforms by executing an algorithm, in said processor that employs an unsupervised learning method and that uses at least one of said multiple first database signal waveforms, and tissue parameters that are assigned to said multiple first database signal waveforms, as input parameters to said algorithm.

5. A method as claimed in claim 4 comprising, in said unsupervised learning method, automatically classifying said at least one of said multiple first database signal waveforms and tissue parameters into multiple material classes in said defined plurality of different material classes, and selecting at least one first database signal waveform for each of said multiple material classes in said defined plurality of different material classes, with the selected at least one first database signal waveform forming at least one second database signal waveform in said second signal waveform database.

6. A method as claimed in claim 5 comprising implementing said unsupervised learning method under a predefined boundary condition that specifies a maximum number for said multiple material classes in said defined plurality of different material classes.

7. A method as claimed in claim 1 comprising, in said processor, optimizing said magnetic resonance fingerprinting method used to acquire said magnetic resonance signal waveform dependent on said second signal waveform database.

8. A method as claimed in claim 7 wherein said multiple second database signal waveforms represent different material classes in said defined plurality of different material classes, and comprising optimizing said magnetic resonance fingerprinting method by selecting scan parameters dependent on said different material classes in said defined plurality of different material classes.

9. A method as claimed in claim 7 comprising optimizing said magnetic resonance fingerprinting method dependent on an optimization criterion that requires a clearest possible assignment of the magnetic resonance signal waveform to a respective second database signal waveform of said second signal waveform database in said signal comparison.

10. A method as claimed in claim 9 wherein said optimization criterion is a first optimization criterion, and optimizing said magnetic resonance fingerprinting method dependent on a second optimization criterion that requires a shortest possible scan time for acquiring said magnetic resonance signal waveform.

11. A method as claimed in claim 7 comprising optimizing said magnetic resonance fingerprinting method using an optimization algorithm selected from the group consisting of a brute-force search strategy, a genetic programming algorithm, an evolutionary algorithm, and a simulation of expected signal waveforms using the Bloch equations.

12. A method as claimed in claim 1 comprising acquiring magnetic resonance signal waveforms for all voxels of said examination region, and comparing the acquired magnetic resonance signal waveforms with the second database signal waveforms, and assigning all voxels of the examination region respectively to material classes among said defined plurality of different material classes based on said result of said signal comparison, and providing said result of said signal comparison as a map of said examination region segmented into said defined plurality of different material classes.

13. A magnetic resonance apparatus comprising:
a magnetic resonance data acquisition scanner;
a processor provided with a first signal waveform database, said first signal waveform database containing multiple first database signal waveforms;
being provided with an input that defines a plurality of different material classes to be segmented in an examination region of a subject;
said processor being configured to generate a second signal waveform database comprising multiple second database signal waveforms that are fewer in number than said multiple first database signal waveforms by selecting a number of said first database signal waveforms that represent said defined plurality of different material classes, and that are less than all of said first database signal waveforms, so that said number of first database signal waveforms form said multiple second database signal waveforms, said multiple second signal database waveforms thereby also representing said defined plurality of different material classes;

said processor being configured to operate a magnetic resonance data acquisition scanner to acquire a magnetic resonance signal waveform of a voxel of said examination region of the subject by executing a magnetic resonance fingerprinting method;

said processor being configured to conduct a signal comparison of said magnetic resonance signal waveform with the multiple second database signal waveforms in the second signal waveform database to obtain a comparison result and to assign said voxel of said examination region to a material class among said defined plurality of different material classes based on said result of said signal comparison; and said processor being configured to provide said comparison result from said processor in electronic form.

14. A non-transitory, computer-readable data storage medium encoded with programming instructions, said storage medium being loaded into a control computer of a magnetic resonance apparatus that comprises a magnetic resonance data acquisition scanner, said programming instructions causing said control computer to:

receive a first signal waveform database, said first signal waveform database containing multiple first database signal waveforms;

receive an input that defines a plurality of different material classes to be segmented in an examination region of a subject;

generate a second signal waveform database comprising multiple second database signal waveforms that are fewer in number than said multiple first database signal waveforms by selecting a number of said first database signal waveforms that represent said defined plurality of different material classes, and that are less than all of said first database signal waveforms, so that said number of first database signal waveforms form said multiple second database signal waveforms, said multiple second signal database waveforms thereby also representing said defined plurality of different material classes;

operate the magnetic resonance data acquisition scanner to acquire a magnetic resonance signal waveform of a voxel of said examination region of the subject by executing a magnetic resonance fingerprinting method;

conduct a signal comparison of said magnetic resonance signal waveform with the multiple second database signal waveforms in the second signal waveform database to obtain a comparison result and assign said voxel of said examination region to a material class among said defined plurality of different material classes based on said result of said signal comparison; and provide said comparison result from said control computer in electronic form.

* * * * *